US008982317B2

(12) United States Patent
Wiener et al.

(10) Patent No.: US 8,982,317 B2
(45) Date of Patent: Mar. 17, 2015

(54) COOLING OF ACTUATOR COILS

(75) Inventors: Roberto B. Wiener, Ridgefield, CT (US); Pradeep K. Govil, Norwalk, CT (US); Michael Emerson Brown, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 1107 days.

(21) Appl. No.: 12/533,888

(22) Filed: Jul. 31, 2009

(65) Prior Publication Data
US 2010/0026974 A1  Feb. 4, 2010

Related U.S. Application Data

(60) Provisional application No. 61/085,179, filed on Jul. 31, 2008.

(51) Int. Cl.
*G03B 27/52* (2006.01)
*G03F 7/20* (2006.01)

(52) U.S. Cl.
CPC ............ *G03B 27/52* (2013.01); *G03F 7/70758* (2013.01)
USPC .................... 355/30; 355/67; 355/72; 355/75

(58) Field of Classification Search
CPC . G03B 27/52; G03F 7/70758; G03F 7/70858; G11B 5/5521; H02K 9/22
USPC ............. 355/30, 53, 67, 72, 75, 77; 361/704; 310/12, 13, 27, 58, 60; 335/302; 336/200
See application file for complete search history.

(56) References Cited

U.S. PATENT DOCUMENTS

| | | | | |
|---|---|---|---|---|
| 3,508,092 A | * | 4/1970 | Hallidy | 310/64 |
| 3,722,082 A | * | 3/1973 | Hoell | 29/605 |
| 6,078,477 A | * | 6/2000 | Adams et al. | 360/265.8 |
| 6,724,290 B1 | * | 4/2004 | Ohnmacht et al. | 336/200 |
| 2004/0218166 A1 | * | 11/2004 | Vreugdewater et al. | 355/72 |
| 2005/0231048 A1 | * | 10/2005 | Galburt | 310/64 |
| 2007/0285845 A1 | * | 12/2007 | Nayak et al. | 360/261.1 |

* cited by examiner

*Primary Examiner* — Toan Ton
*Assistant Examiner* — Mona M Sanei
(74) *Attorney, Agent, or Firm* — Sterne, Kessler, Goldstein & Fox P.L.L.C

(57) ABSTRACT

In order to effectively transfer heat from inner layers of an actuator coil to an area external to the coil, heat transfer elements, located proximate to the actuator coil, can be used. In an embodiment, a heat transfer apparatus for the actuator coil can include one or more heat transfer elements located proximate to one or more layers or one or more windings of the actuator coil and a cooling surface located proximate to the one or more heat transfer elements and to the actuator coil. In this configuration, the heat transfer apparatus can transfer heat from inner layers of the actuator coil to the cooling surface, which in turn transfers the heat to an area external to the actuator coil.

5 Claims, 13 Drawing Sheets

COOLING OF ACTUATOR COILS

CROSS-REFERENCE TO RELATED APPLICATIONS

The present application claims the benefit under 35 U.S.C §119(e) of U.S. Provisional Patent Application No. 61/085,179, filed Jul. 31, 2008, which is incorporated herein by reference in its entirety.

BACKGROUND

1. Field

Embodiments of the present invention generally relate to the field of heat dissipation in electromechanical devices and, more particularly, to the cooling of actuator coils.

2. Background

Motor coils are used in a wide array of applications including, for example, hard disk drives and lithography tools. In general, a motor coil includes an actuator coil that contains numerous windings of a wire and a magnetic device. The magnetic device can include one or more permanent magnets. As electric current is passed through the actuator coil, an electromagnetic field is established, which interacts with a magnetic field produced from the magnetic device to cause a force to be exerted on the actuator coil. This force causes the actuator coil to move. In the alternative, the magnetic device can move, while the actuator coil remains stationary, when the electromagnetic field is established between the magnetic device and the actuator coil.

The movement of the actuator coil can be controlled by adjusting the electric current flowing through the actuator coil, where a force on the actuator coil is proportional to the electric current. To increase the force, the electric current must also be increased. However, as the current is increased, the operating temperature of the actuator coil also increases in the form of electrical energy dissipating as heat energy within the actuator coil. The resistance of the actuator coil, in turn, increases and the magnitude of the current flowing through the actuator coil is limited, thereby adversely affecting the performance of the motor coil.

One common solution for applications requiring a rapidly moving motor coil is the use of heat transfer elements. Current heat transfer elements are placed on top, bottom, and side surfaces of the actuator coil and configured to cool the outside layers of the coil. However, these heat transfer designs do not effectively transfer heat away from the inner layers of the coil, where coil temperature can be at its highest.

SUMMARY

Therefore, what is needed is a heat transfer mechanism that can effectively transfer heat away from inner layers of an actuator coil. For example, in order to effectively transfer heat from inner layers of an actuator coil to an area external to the coil, heat transfer elements, located proximate the actuator coil, can be used.

In an embodiment of the present invention, a heat transfer apparatus includes one or more heat transfer elements located proximate to one or more layers or one or more windings of an actuator coil and a cooling surface proximate to the one or more heat transfer elements and to the actuator coil. The cooling surface is configured to transfer heat from the one or more heat transfer elements to an area external to the actuator coil. The heat transfer apparatus can also include a conductive device located proximate to a central opening of the actuator coil and coupled to the cooling surface. The conductive device is configured to transfer heat from the central opening of the actuator coil to the area external to the coil.

The heat transfer elements can be fabricated from a strip or sheet of thermally conductive material with high electrical resistivity such as, but not limited to, for example a diamond insert. Alternatively, the heat transfer element can be fabricated from a thermally conductive material with low electrical resistivity, where the effect of eddy currents may need to be minimized through techniques such as, for example, etching of the heat transfer element. The heat transfer elements can be located proximate to various locations of the actuator coil such as, but not limited to, for example a central region of windings of the actuator coil. This central region can be an area of the actuator coil with a higher temperature relative to other areas of the actuator coil when the actuator coil is in operation. Thus, one or more heat transfer elements can be positioned proximate to this area to effectively transfer heat away from this region of the actuator coil.

The cooling surface can include a diamond insert with a structure outwardly extending from the actuator coil. Alternatively, the cooling surface can include a plate that is coupled to the one or more heat transfer elements and the actuator coil.

In another embodiment, a method for transferring heat away from an actuator coil includes the following: conducting heat away from one or more layers or one or more windings within the actuator coil with one or more heat transfer elements; and, transferring heat from the one or more transfer elements to an area external to the actuator coil using a cooling surface. The method can also include transferring heat from a center of the actuator coil to the area external to the actuator coil using a conductive device proximate to a central opening of the actuator coil.

In yet another embodiment, a lithographic apparatus can include the following: a support structure configured to support a patterning device, the patterning device configured to pattern a beam of radiation received from an illumination system; a substrate support configured to support a substrate when the patterned beam of radiation is projected onto a target portion of the substrate by a projection system; and, a heat transfer apparatus located within at least one of the support structure, the substrate support, the illumination system, and the projection system, the heat transfer apparatus including one or more heat transfer elements proximate to one or more layers or one or more windings of an actuator coil and a cooling surface coupled to the one or more heat transfer elements and to the actuator coil and configured to transfer heat away from the one or more elements to an area external to the actuator coil.

Further embodiments, features, and advantages of the present invention, as well as the structure and operation of the various embodiments are described in detail below with reference to accompanying drawings.

BRIEF DESCRIPTION OF THE DRAWINGS

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

In the following description, for purposes of explanation, numerous specific details are set forth in order to provide a thorough understanding of embodiments of the present invention. It will be evident, however, to one skilled in the relevant art that embodiments of the present invention can be practiced without these specific details. In other instances, well-known circuits, structures, and techniques are not shown in detail, but rather in a block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
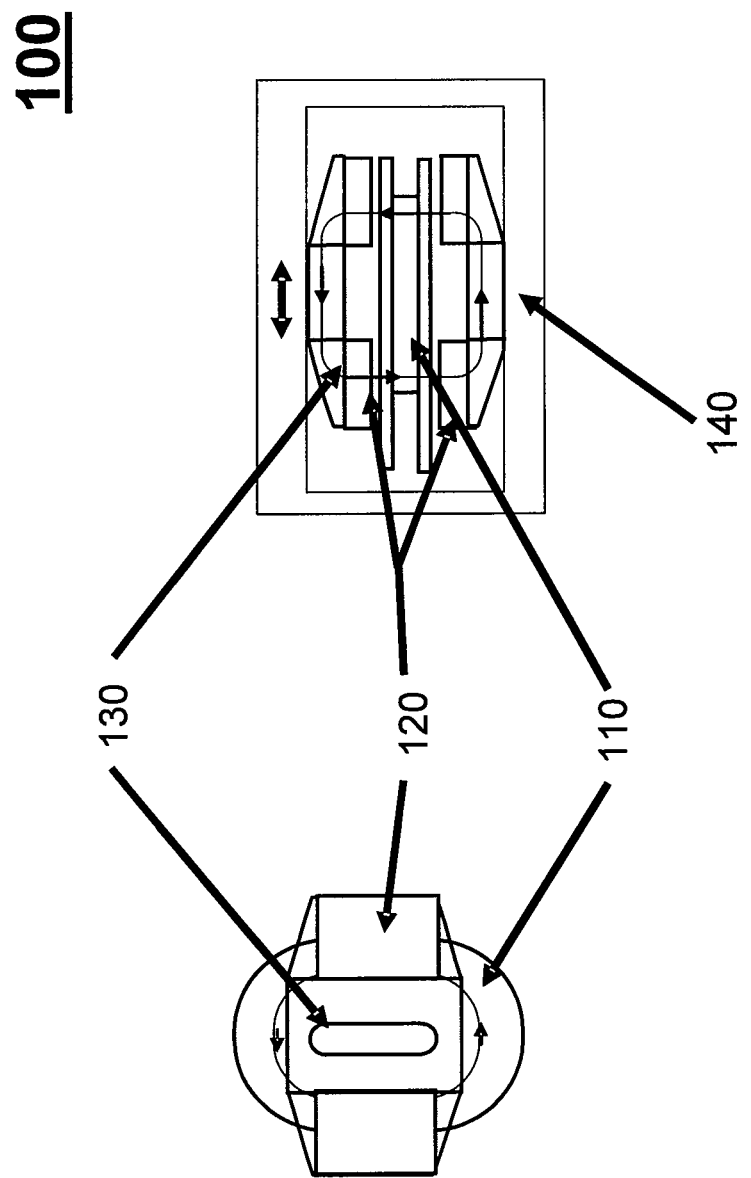
FIG. 1 is an illustration of an exemplary motor coil.

FIG. 1 is an illustration of an exemplary motor coil 100 with an actuator coil 110 and permanent magnets 120. Permanent magnets 120 can be coupled to a back iron plate 130, as actuator coil 110 moves within an enclosure 140 housing motor coil 100. In the alternative, actuator coil 110 can be in a fixed or stationary position as permanent magnets 120 move within enclosure 140. For explanatory purposes, it will be assumed that actuator coil 110 moves within enclosure 140, while permanent magnets 120 are in a fixed or stationary position.

The movement of actuator coil 110 can be controlled by adjusting an electric current flowing through actuator coil 110, where a force on actuator coil 110 is proportional to the electric current. More specifically, to increase the force on actuator coil 110, electric current flowing through actuator coil 110 must also be increased. However, as the electric current is increased, an operating temperature of actuator coil 110 also increases as electrical energy dissipating as heat energy within actuator coil 110. A resistance of actuator coil 110, in turn, increases and a magnitude of the current flowing through actuator coil 110 is limited, thereby adversely affecting the performance of motor coil 100.

Figure 2:
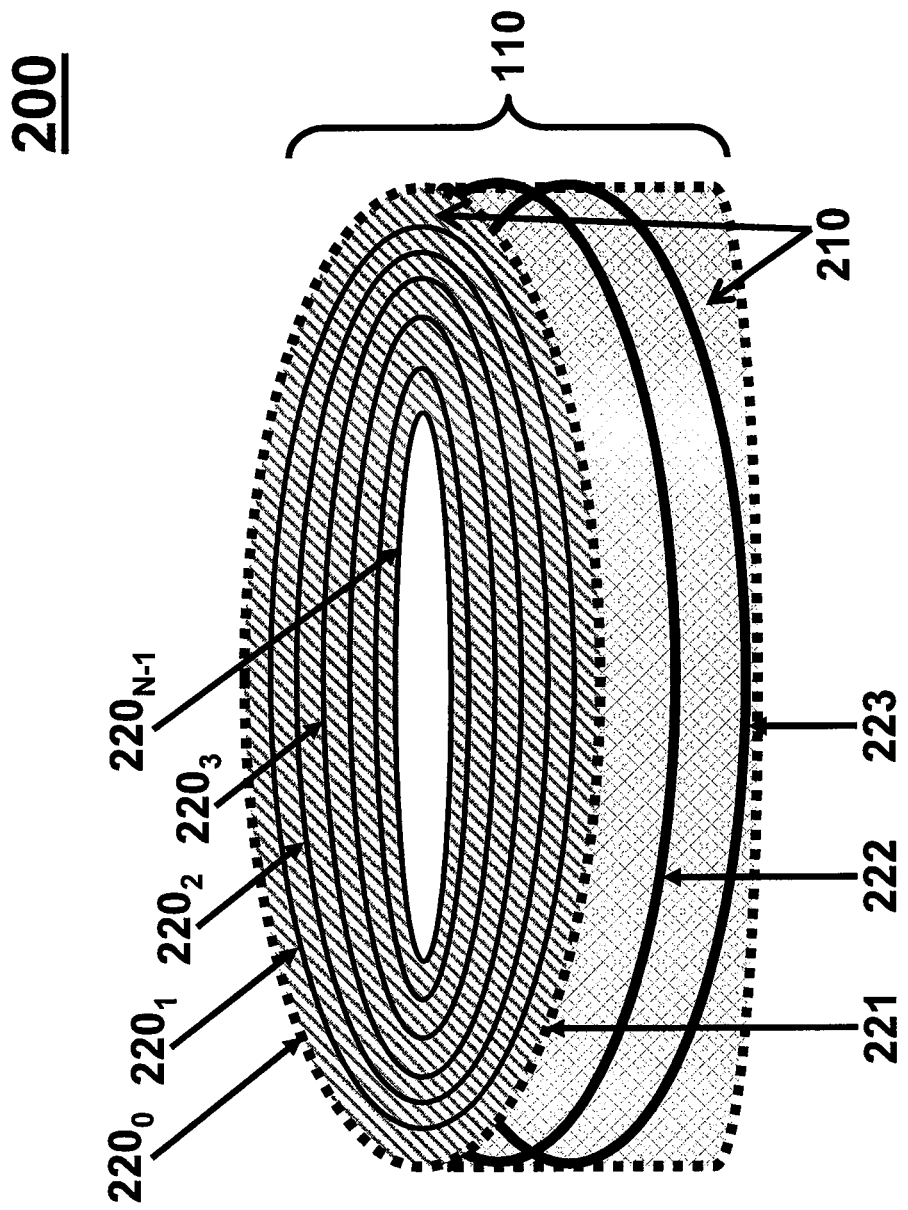
FIG. 2 is an illustration of a heat transfer configuration.

FIG. 2 is an illustration of a heat transfer configuration 200 with a cooling surface or surfaces 210 (shaded areas on top and side surfaces of actuator coil 110) surrounding an outer surface or surfaces of actuator coil 110. Actuator coil 110 is configured as a plurality of layers 221-223, where each layer 221-223 includes an "N" number of windings $220_0$-$220_{N-1}$. Within each layer 221-223, windings $220_0$-$220_{N-1}$ can be concentrically configured as a loop. In heat transfer configuration 200, a cooling surface or surfaces 210 are configured to transfer heat from top, bottom (not shown in FIG. 2), and side surfaces of actuator coil 110 away from actuator coil 110. However, heat transfer configuration 200 may not effectively transfer heat from inner layer 222 of actuator coil 110, where the increased temperature can be highest.

Figure 3:
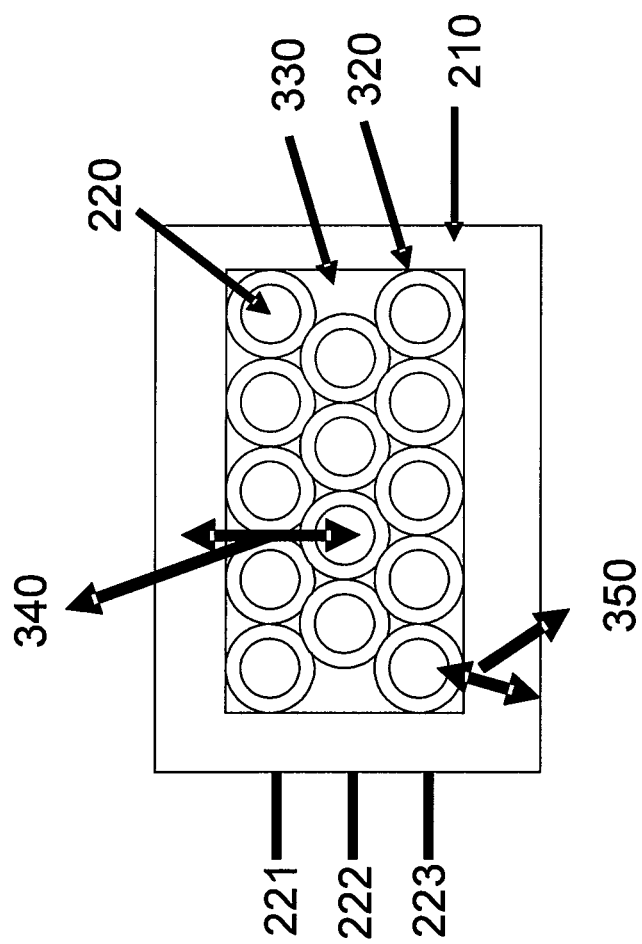
FIG. 3 is an illustration of an exemplary cross-section of an actuator coil.

FIG. 3 is an illustration of an exemplary cross-section of actuator coil 110. In one example, each wire 220 in actuator coil 110 may have an insulation layer 320. Further, each wire 220 in actuator coil 110 can be held in place using, for example, a potting material 330 that is distributed between cooling surface 210 an wires 220.

As electric current flows through wires 220, inner layer 222 of actuator coil 110 can reach a higher temperature than that of outer layers 221 and 223. This generates a temperature gradient between inner layer 222 and outer layers 221 and 223 of actuator coil 110, which may be due to a higher thermal resistance path 340 from inner layer 222 of actuator coil 110 to cooling surface 210 than a thermal resistance path 350 from outer layer 223 of actuator coil 110 to cooling surface 210. Higher thermal resistance path 340 of inner layer 222 can be attributed to several factors such as, for example a distance that heat travels from inner layer 222 of actuator coil 110 to cooling surface 210, insulation 320 of wires 220, and a low thermal conductivity of potting material 330.

In one example, as the temperature rises in actuator coil 110 due to an increase in electric current flowing through actuator coil 110, a resistivity of each of wires 220 may also increase. This may increase an amount of electric current needed to generate a same amount of force, especially in inner layer 222 of actuator coil 110. Additionally, an increase in the temperature may degrade insulation 320 and potting material 330, resulting in electrical shorts in actuator coil 110. Accordingly, a more effective heat transfer mechanism may be desired.

Figure 4:
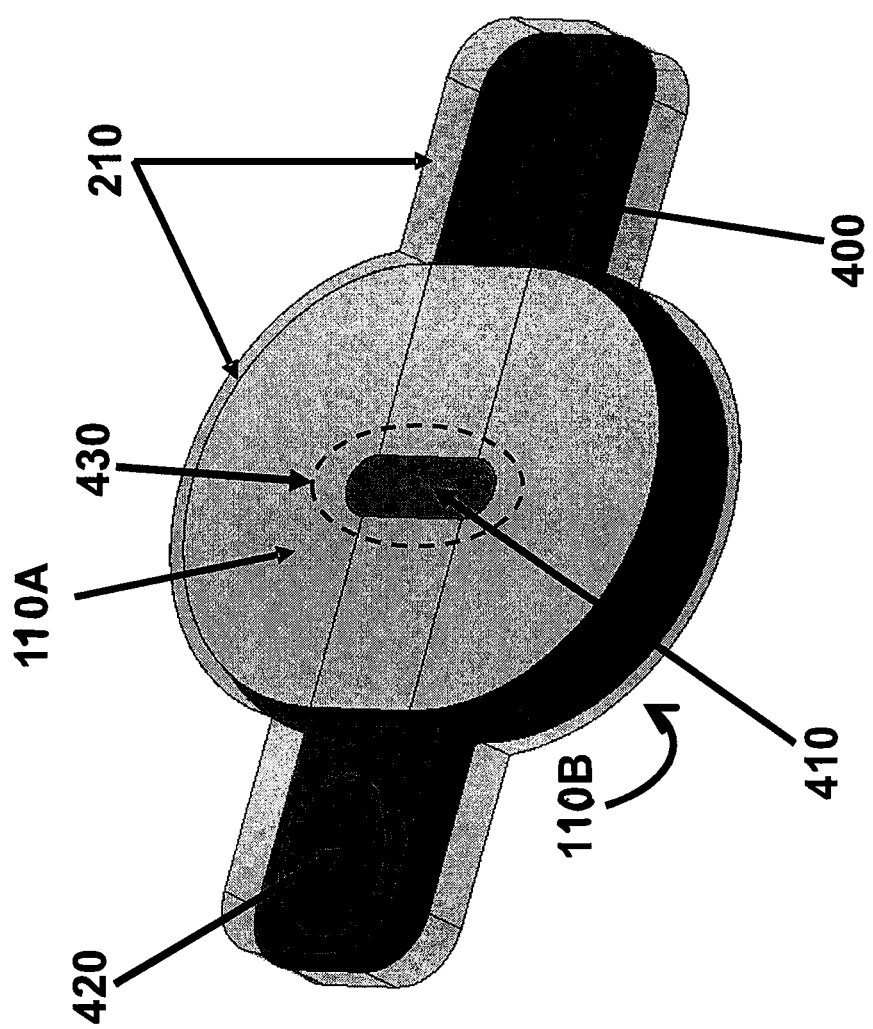
FIG. 4 is an illustration of an embodiment of a heat transfer apparatus for an actuator coil.

FIG. 4 is an illustration of an embodiment of a heat transfer apparatus 400 for actuator coil 110. Although a circular actuator coil 110 is used in the description of embodiments of heat transfer apparatus 400, a person skilled in the art will recognize, based on the description herein, that alternative embodiments of heat transfer apparatus 400 may include actuator coils with other shapes. These shapes include, but are not limited to, for example an oval, rectangle, and square.

In one example, actuator coil 110 is configured to decrease the temperature of inner layer 222 of actuator coil 110 by transferring heat from inner layer 222 of actuator coil 110 to an area 420 external to actuator coil 110. Based on a location of heat transfer apparatus 400 in actuator coil 110, this may minimize the temperature gradients between inner layer 222 and outer layers 221 and 223 of actuator coil 110. Based on the description herein, a person skilled in the art will recognize that heat transfer apparatus 400 can be implemented in an actuator coil with two or more layers of windings to minimize a temperature gradient between inner and outer layers of the actuator coil.

In one example, heat transfer apparatus 400 can be formed as two portions 110A and 110B, and apparatus 400 can be disposed between the two portions 110A and 110B of actuator coil 110 (e.g., a top portion 110A of actuator coil 110 and a bottom portion 110B of actuator coil 110). In an embodiment, portion 110A can include layer 221 of actuator coil 110 and portion 110B can include layers 222 and 223 of actuator coil 110. In this configuration, heat transfer apparatus 400 can be disposed between layers 221 and 222 to conduct heat from this region and surrounding regions of actuator coil 110. In a further example, heat transfer apparatus 400 can include a strip or sheet of thermally conductive material with low electrical resistivity. A person skilled in the art will recognize that if heat transfer apparatus 400 is fabricated from a thermally conductive material with low electrical resistivity, then the material may need to be etched in order to minimize an eddy current effect when the material is exposed to a changing magnetic field. In yet another example, heat transfer apparatus 400 can include a layer of thermally conductive material with high electrical resistivity such as, but not limited to, for example a diamond insert. Further, as shown in FIG. 4, heat transfer apparatus 400 can extend from actuator coil 110 such that heat can be transferred to area 420 external to actuator coil 110.

Additionally, or alternatively, cooling surface 210 can be located around or surround both heat transfer apparatus 400 and actuator coil 110.

Additionally, or alternatively, a thermally conductive lead 410 (or "plug") can be inserted in a central opening or portion 430 of actuator coil 110. Lead 410 may also be coupled to or in contact with cooling surface 210, such that heat can be transferred away from central portion or opening 430 of actuator coil 110.

As compared to heat transfer configuration 200 in FIG. 2, heat transfer apparatus 400 can effectively transfer heat away from areas of actuator coil 110 having higher temperatures than other areas. These areas having higher temperatures may be near central opening or portion 430 of actuator coil 110, where thermal conductivity can be at its lowest. As described above, with respect to heat transfer configuration 200, the heat dissipated from inner layer 222 of actuator coil 110 cannot be effectively transferred to cooling surface 210 due to the low thermal conductivity in this region of actuator coil 110. However, through use of heat transfer apparatus 400, heat from high-temperature regions of actuator coil 110 is effectively transferred to outer layers of actuator coil 110 since apparatus 400 can be positioned in close proximity to inner layer 222 of actuator coil 110.

In one example, heat transfer apparatus 400 may also improve reliability in actuator coil 110 as compared to heat transfer configuration 200 since heat transfer apparatus 400 may reduce degradation in coil wire insulation 320 and potting material 330 (see FIG. 3). This is because heat from higher-temperature areas of actuator coil 110 is efficiently transferred away, allowing wire insulation 320 and potting material 330 to remain cooler, which helps to reduce degradation. This may also increase overall performance and life of actuator coil 110 because actuator coil 110 may be less sensitive to manufacturing tolerances such as, but not limited to, for example coil diameter and resistivity variations.

Figure 5:
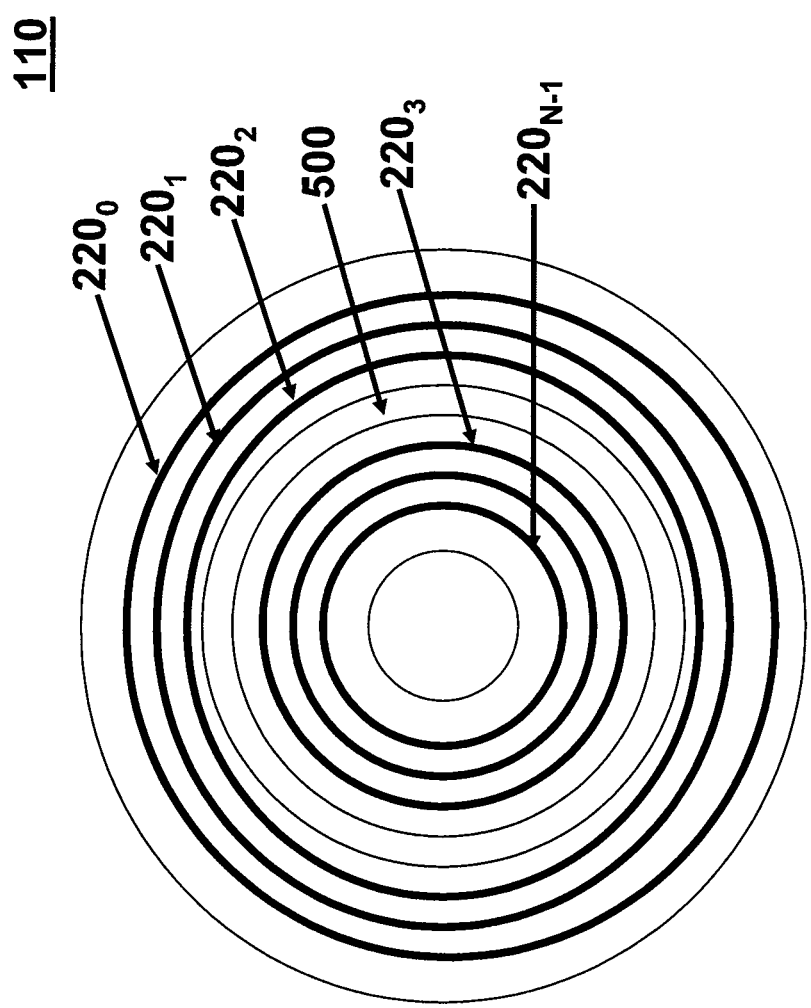
FIG. 5 is an illustration of another embodiment of a heat transfer apparatus for an actuator coil.

FIG. 5 is an illustration of another embodiment of a heat transfer apparatus 500 for actuator coil 110. In this embodiment, heat transfer apparatus 500 is inserted between windings $220_2$ and $220_3$ of actuator coil 110 and is configured to conduct dissipated heat from a region of actuator coil 110 encompassing windings $220_2$ and $220_3$ and surrounding regions. Additionally or alternatively, heat transfer apparatus 500 can include a strip or sheet of thermally conductive material with low electrical or with high electrical resistivity that is disposed between windings $220_2$ and $220_3$. As a person skilled in the art will appreciate that if a material with low electrical resistivity is used, then the effect of eddy currents in the material may need to be minimized (e.g., etching of the heat transfer element).

Figure 6:
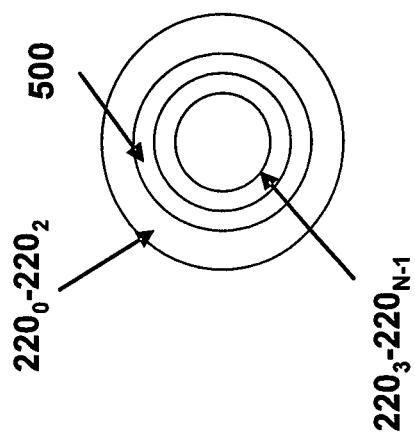
FIG. 6 is an illustration of an embodiment of a heat transfer apparatus coupled to a coil plate.

FIG. 6 is an illustration of an embodiment of heat transfer apparatus 500 associated with a coil plate 610. In one example, coil plate 610 can be configured as at least a portion of an inner layer of actuator coil 110. In an embodiment, a portion of coil plate 610 can be a thermally-conductive layer disposed between layers 221 and 222 of actuator coil 110 and associated with heat apparatus 500 in this layer of actuator coil 110. As heat is generated by inner windings $220_2$ and $220_3$ of actuator coil 110, heat transfer apparatus 500 can transfer the heat to an area 620 external to actuator coil 110 via coil plate 610. Coil plate 610 can be fabricated from a variety of thermally conductive materials such as, but not limited to, for example diamond and copper. A person skilled in the art will recognize that when using copper, or other electrical conductors, the effect of eddy currents may need to be mitigated. Further, a person skilled in the art will recognize that coil plate 610 can house one or more actuator coils 110.

Figure 7:
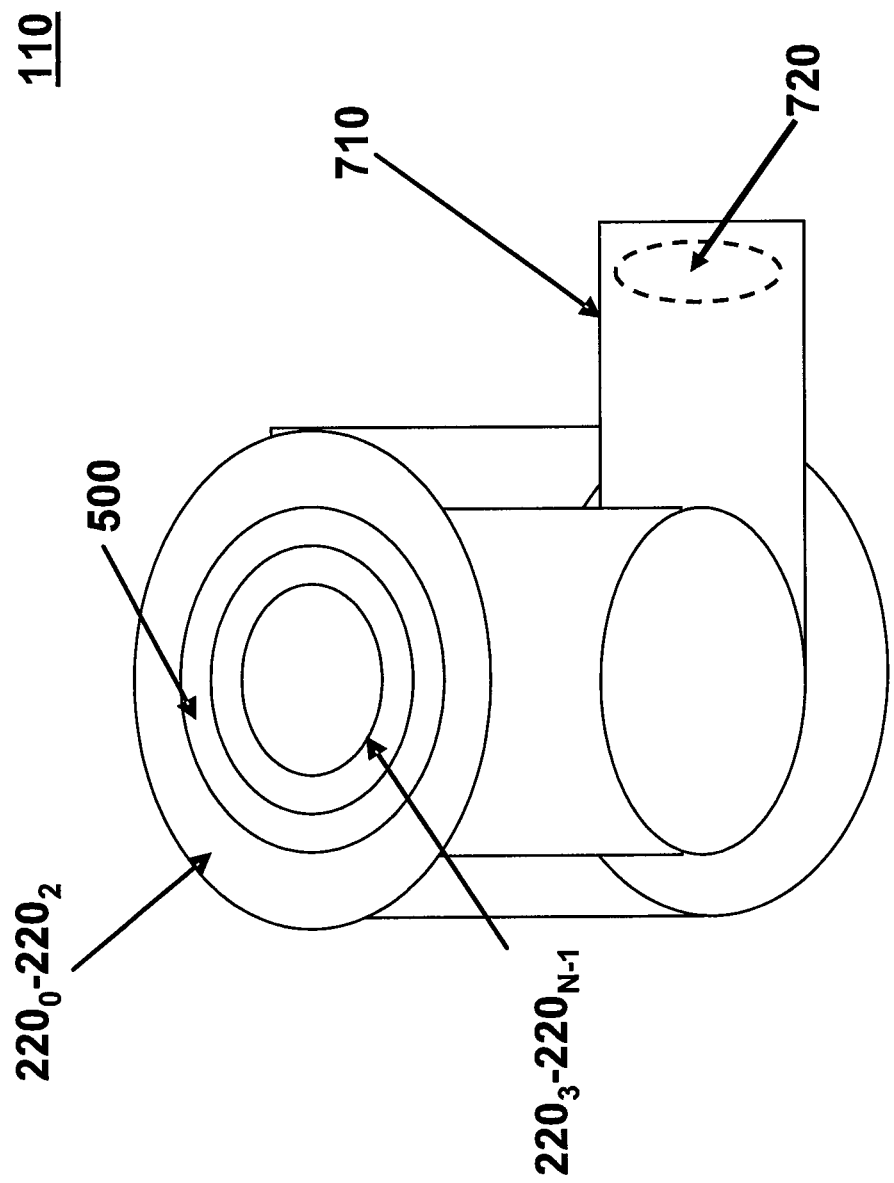
FIG. 7 is an illustration of an embodiment of a heat transfer apparatus coupled to a face plate.

FIG. 7 is an illustration of an embodiment of heat transfer apparatus 500 coupled to a face plate 710. In various examples, face plate 710 can be associated with a top surface, a bottom surface, or both top and bottom surfaces of heat transfer apparatus 500. Additionally, or alternatively, face plate 710 can also associated with one or more surfaces of actuator coil 110 (e.g., a top surface, a bottom surface, or both top and bottom surfaces of actuator coil 110) to facilitate a transfer of heat to an area 720 external to actuator coil 110. Thus, as heat is generated by inner windings of actuator coil 110 (e.g., windings $220_2$ and $220_3$), heat transfer apparatus 500 can transfer the heat away from this region of actuator coil 110 via face sheet 710.

In the discussion set forth above, the heat transfer configurations described in FIGS. 4-7 are used as mechanisms to transfer heat away from actuator coil 110. Based on the description herein, a person skilled in the relevant art will appreciate that other heat transfer mechanisms and techniques can be used to transfer heat away from actuator coil 110. These other heat transfer mechanisms and techniques are within the scope and spirit of the present invention.

Figure 8:
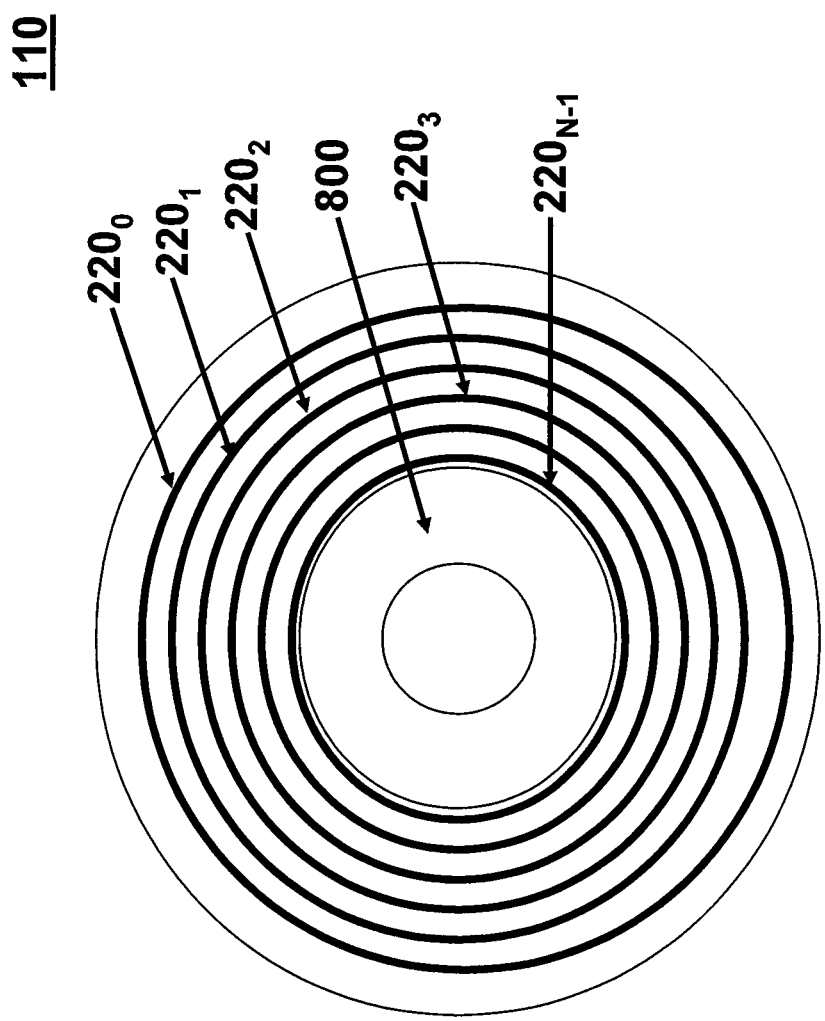
FIG. 8 is an illustration of an embodiment of a heat transfer apparatus for an actuator coil, where the heat transfer apparatus is proximate to a center of the actuator coil.
Figure 9:
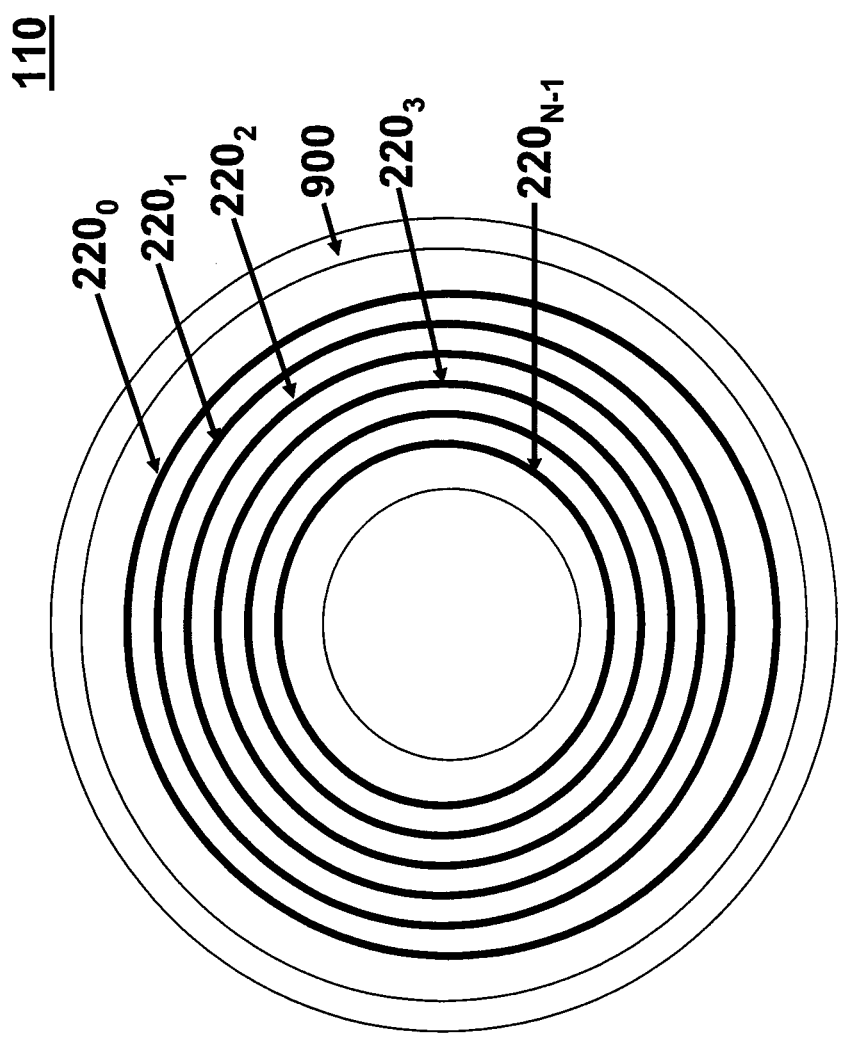
FIG. 9 is an illustration of an embodiment of a heat transfer apparatus for an actuator coil, where the heat transfer apparatus is proximate to a periphery of the actuator coil.
Figure 10:
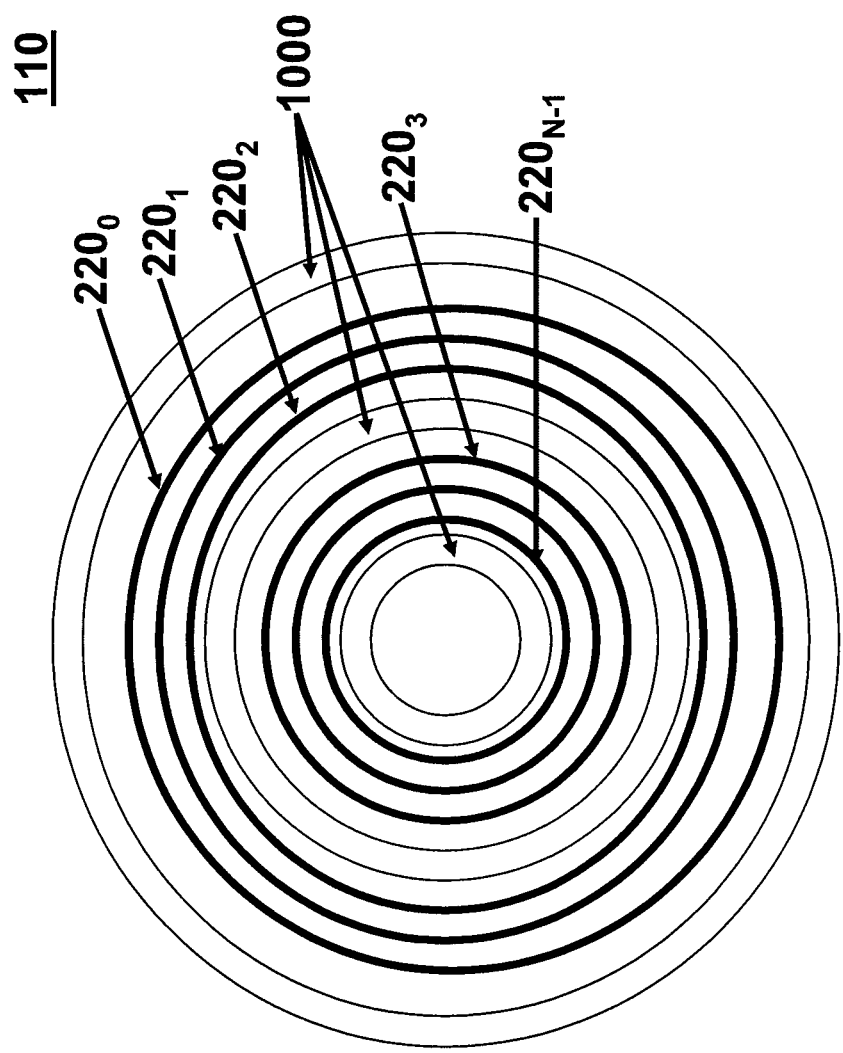
FIG. 10 is an illustration of an embodiment of a heat transfer apparatus for an actuator coil, where the heat transfer apparatus is located in multiple locations of the actuator coil.

In one example, one or more conductive rings can be used in various locations of actuator coil 110 to transfer heat from a region of actuator coil 110 with one or more windings (e.g., windings $220_0$-$220_{N-1}$) to an area external to actuator coil 110. For instance, FIG. 8 is an illustration of an embodiment of heat transfer apparatus 800 inserted proximate to a center winding (e.g., winding $220_{N-1}$) of actuator coil 110. In this configuration, heat dissipated from central windings of actuator coil 110 can be transferred away from actuator coil 110 via heat transfer apparatus 800. FIG. 9 is an illustration of an embodiment of heat transfer apparatus 900 located proximate to an outer surface of actuator coil 110 such that heat dissipating from outer windings (e.g., winding $220_0$) can be transferred away from actuator coil 110. FIG. 10 is an illustration of an embodiment of heat transfer apparatus 1000 located in multiple locations of actuator coil 110. It is to be understood that more or less locations may be utilized than are shown in this example. Heat dissipated from actuator coil 110 can be transferred from the locations including portions of heat transfer apparatus 1000 to an area external to the coil. Additionally, or alternatively, this can been done using coil plate 610 in FIG. 6 or face plate 710 in FIG. 7.

A person skilled in the art will also recognize that the placement of the heat transfer apparatus, according to embodiments of the present invention, may be implementation specific. For instance, in designing the heat transfer apparatus according to embodiments of the present invention, a thermal analysis of a specific actuator coil design can reveal what areas have higher temperature during operation than other areas. Then, a heat transfer apparatus can be located in the area or areas of the actuator coil to efficiently transfer heat away from the high-temperature area and away from the actuator coil.

Figure 11:
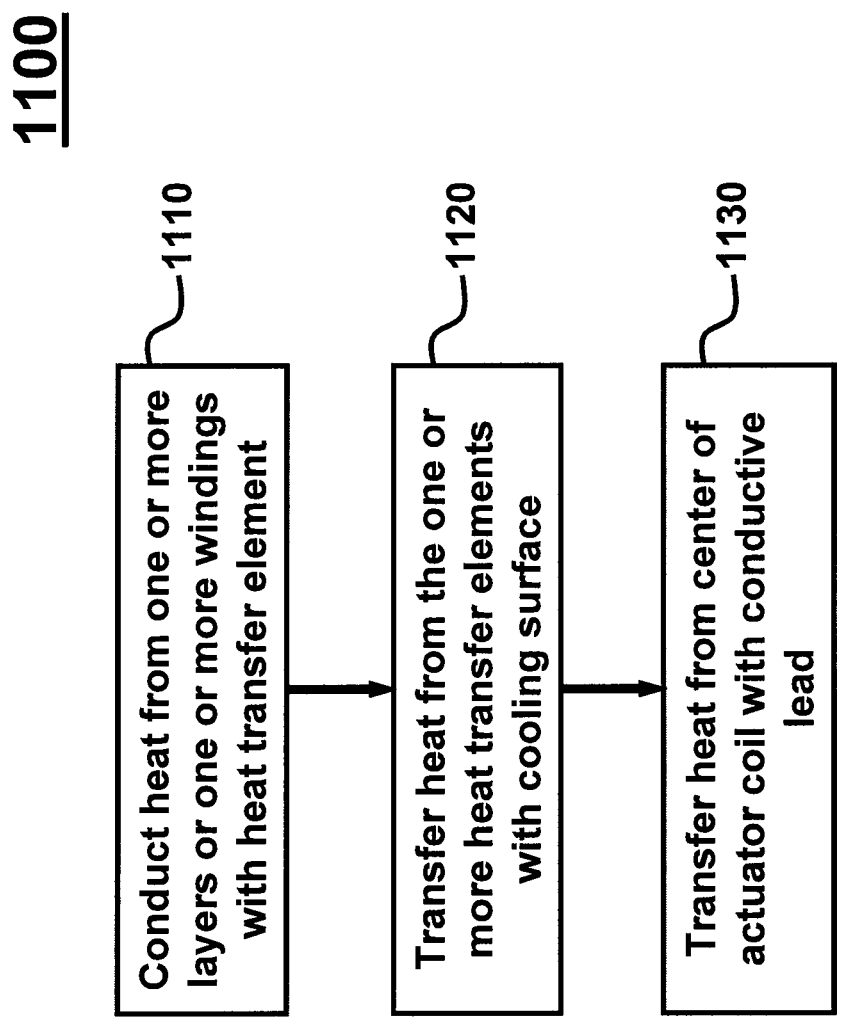
FIG. 11 is an illustration of an embodiment of a method for transferring heat away from an actuator coil.

FIG. 11 is a flowchart depicting an embodiment of a method 1100 for efficiently transferring heat away from an actuator coil. Method 1100 can occur using, for example, one or more of the heat transfer apparatus discussed above with reference to FIGS. 4-10. In step 1110, heat is conducted from one or more layers or one or more windings within the actuator coil with one or more heat transfer elements. In an embodiment, the heat transfer elements can thermally conduct heat from the actuator coil to an area external to the actuator coil, while maintaining high electrical resistivity. Alternatively, in another embodiment, the heat transfer elements can thermally conduct heat from the actuator coil to an area external to the coil, while maintaining low electrical resistivity.

In one example, the heat transfer element can be located in a central region of the actuator coil.

In step 1120, a cooling surface transfers heat from the one or more heat transfer elements away from the actuator coil. The cooling surface can be coupled to the one or more heat transfer elements and to the actuator coil (e.g., top, bottom, and side surfaces of the coil). In an embodiment, the cooling surface can be a coil plate (e.g., coil plate 610 in FIG. 6) that transfers heat from inner layers of the coil to an area external to the actuator coil.

In step 1130, a conductive lead transfers heat from a center of the actuator coil to an area external to the actuator coil. The conductive lead can be inserted into a central opening of the actuator coil. In an embodiment, the conductive lead can be coupled to the cooling surface such that dissipated heat from the center of the actuator coil can be transferred away from the coil.

Figure 12:
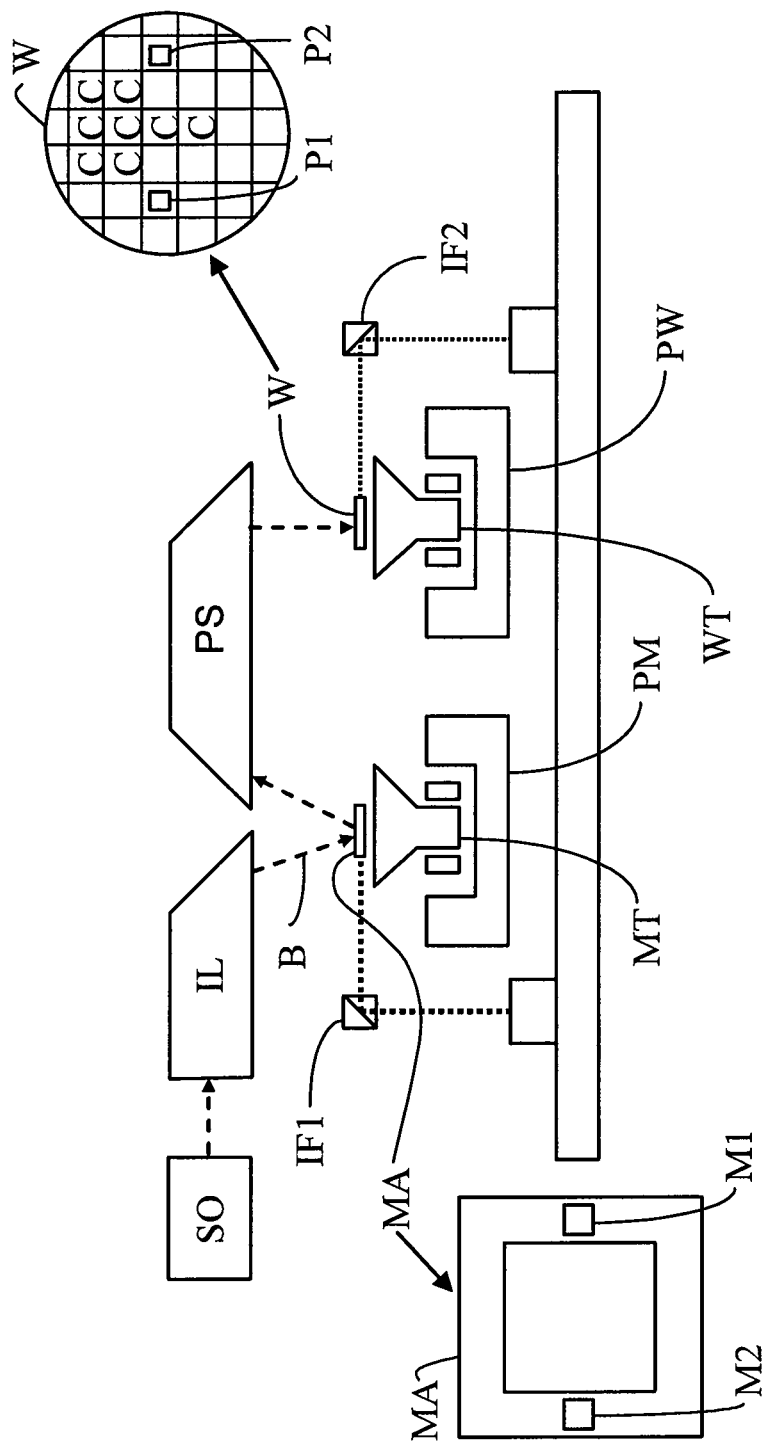
FIG. 12 is an illustration of an exemplary lithographic apparatus that can implement embodiments of a heat transfer apparatus for an actuator coil.

Embodiments of the present invention can be used in systems such as, for example but not limited to, lithography tools. FIG. 12 is an illustration of a lithographic apparatus 1200 that can implement embodiments of the present invention. The apparatus 1200 includes an illumination system (illuminator) IL configured to condition a radiation beam B (e.g., UV radiation or EUV radiation). A support MT (e.g., a mask table) is configured to support a patterning device MA (e.g., a mask) and is connected to a first positioner PM that is configured to accurately position the patterning device in accordance with certain parameters. A substrate table WT (e.g., a wafer table) is configured to hold a substrate W (e.g., a resist-coated wafer) and is connected to a second positioner PW that is configured to accurately position the substrate in accordance with certain parameters. A projection system PS (e.g., a refractive projection lens system) is configured to project a pattern imparted to the radiation beam B by patterning device MA onto a target portion C (e.g., including one or more dies) of the substrate W.

The illumination system may include various types of optical components, including, but not limited to, refractive, reflective, magnetic, electromagnetic, electrostatic or other types of optical components, or any combination thereof, to direct, shape, or control radiation.

Support MT bears the weight of the patterning device. Further, support MT holds the patterning device in a manner that depends on the orientation of the patterning device, the design of the lithographic apparatus, and other conditions, such as, for example, whether or not the patterning device is held in a vacuum environment. Support MT can use mechanical, vacuum, electrostatic or other clamping techniques to hold the patterning device. Support MT can be a frame or a table, for example, which may be fixed or movable as required. Support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include, but are not limited to, masks, programmable mirror arrays, and programmable LCD panels. Masks are well known in lithography, and include binary, alternating phase-shift, and attenuated phase-shift masks, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As herein depicted, apparatus 1200 is of a reflective type (e.g., employing a reflective mask). Alternatively, apparatus 1200 may be of a transmissive type (e.g., employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate is covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 12, the illuminator IL receives radiation from a radiation source SO. The source and the lithographic apparatus may be separate entities, for example, when the source is an excimer laser. In such cases, the source is not considered to form part of the lithographic apparatus and the radiation is passed from the source SO to the illuminator IL with the aid of a beam delivery system that, for example, includes suitable directing mirrors and/or a beam expander. In additional embodiments, the source may be an integral part of the lithographic apparatus, for example when the source is a mercury lamp. The source SO and the illuminator IL, together with the beam delivery system BD, if present, may be referred to as a "radiation system."

In an embodiment, the illuminator IL may include an adjuster configured to adjust the angular intensity distribution in a pupil plane of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, the illuminator IL may include various other components, such as an integrator and a condenser. In such embodiments, the illuminator may be used to condition the radiation beam, to have a desired uniformity and intensity distribution in its cross-section.

The radiation beam B is incident on the patterning device (e.g., mask MA) that is held on the support (e.g., mask table MT) and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 (e.g., an interferometric device, linear encoder or capacitive sensor) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1 and M2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a further embodiment, lithographic apparatus 1200 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

Figure 13:
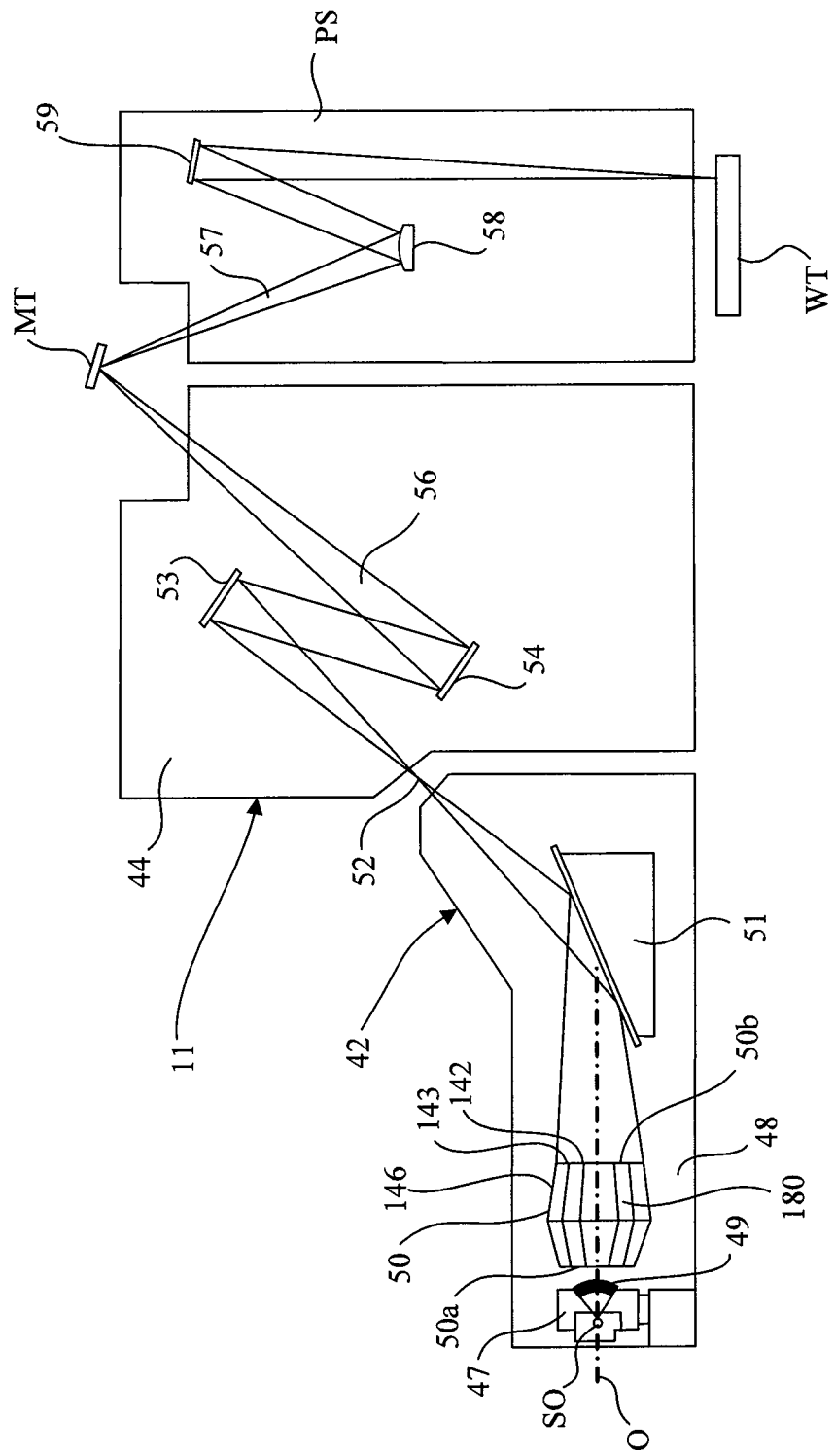
FIG. 13 is an illustration of an exemplary EUV lithographic apparatus that can implement embodiments of a heat transfer apparatus for an actuator coil.

FIG. 13 is an illustration of an exemplary EUV lithographic apparatus 1300 that can implement embodiments of the present invention. In FIG. 13, a projection apparatus 1300 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50*a* and a downstream radiation collector side 50*b*, and radiation passed by collector 50 can be reflected off a grating spectral filter 51 to be focused at a virtual source point 52 at an aperture in the collector chamber 48. Radiation collectors 50 are known to persons skilled in the art.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 13. For example, grating spectral filter 51 may optionally be present, depending upon the type of lithographic apparatus. Further, in an embodiment, illumination optics unit 44 and projection system PS may include more mirrors than those depicted in FIG. 13. For example, projection system PS may incorporate one to four reflective elements in addition to reflective elements 58 and 59. In FIG. 13, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 13, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 13, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. In FIG. 13, the beam of radiation B passes through lithographic apparatus 1300. Following the light path that beam of radiation B traverses through lithographic apparatus 1300, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 13 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may include reflectors 142, 143, and 146 (also known as a "shell" or a Wolter-type reflector including several Wolter-type reflectors). Reflectors 142, 143, and 146 may be nested and rotationally symmetric about optical axis O. In FIG. 13, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may include at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the term "lens," where the context allows, may refer to any one or combination of various types of optical components, including refractive, reflective, magnetic, electromagnetic and electrostatic optical components.

Further, the terms "radiation" and "beam" used herein encompass all types of electromagnetic radiation, including ultraviolet (UV) radiation (e.g., having a wavelength λ of 365, 248, 193, 157 or 126 nm) and extreme ultra-violet (EUV or soft X-ray) radiation (e.g., having a wavelength in the range of 5-20 nm, e.g., 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

While various embodiments of the present invention have been described above, it should be understood that they have been presented by way of example, and not limitation. It will be apparent to persons skilled in the relevant art(s) that various changes can be made therein without departing from the scope of the invention. Furthermore, it should be appreciated that the detailed description of the present invention provided herein, and not the summary and abstract sections, is intended to be used to interpret the claims. The summary and abstract sections may set forth one or more but not all exemplary embodiments of the present invention as contemplated by the inventors.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A heat sink configured to transfer heat away from an actuator coil, the actuator coil including a plurality of windings arranged into first and second portions with the first portion including at least one first winding located in a first plane and the second portion including at least one second winding located in a second plane different than the first plane, the heat sink comprising:

an elongated heat transfer element including a ring situated between first and second arms, wherein the ring is sandwiched between the at least one first winding of the first portion of the actuator coil and the at least one second winding of the second portion of the actuator coil, wherein the first arm outwardly extends from the ring in a first direction and the second arm outwardly extends from the ring in a second direction, wherein the first direction is different than the second direction;

a first cooling surface proximate to the first arm of the elongated heat transfer element and to the actuator coil, the first cooling surface being configured to transfer heat from the elongated heat transfer element to a first area external to the actuator coil; and a second cooling surface proximate to the second arm of the elongated heat transfer element and to the actuator coil, the second cooling surface being configured to transfer heat from the elongated heat transfer element to a second area external to the actuator coil.

2. The heat sink of claim 1, wherein the elongated heat transfer element is parallel to the first plane and to the second plane.

3. The heat sink of claim 1, wherein the elongated heat transfer element comprises a strip or a sheet of thermally conductive material that has high electrical resistivity.

4. The heat sink of claim 3, wherein the elongated heat transfer element comprises a diamond insert.

5. The heat sink of claim 1, wherein each of the first and second cooling surfaces comprises a plate coupled to the elongated heat transfer element and the actuator coil.

* * * * *